(12) United States Patent
Fireaizen

(10) Patent No.: US 8,107,558 B2
(45) Date of Patent: Jan. 31, 2012

(54) ELECTRONIC CIRCUITRY AND METHOD FOR DETERMINATION OF AMPLITUDES OF RECEIVED SIGNALS

(75) Inventor: Moshe Fireaizen, Ganei Tikva (IL)

(73) Assignee: Elta Systems Ltd., Ashdod (IL)

( * ) Notice: Subject to any disclaimer, the term of this patent is extended or adjusted under 35 U.S.C. 154(b) by 505 days.

(21) Appl. No.: 12/350,308

(22) Filed: Jan. 8, 2009

(65) Prior Publication Data

US 2009/0164545 A1    Jun. 25, 2009

Related U.S. Application Data

(63) Continuation of application No. PCT/IL2007/000835, filed on Jul. 4, 2007.

(30) Foreign Application Priority Data

Jul. 11, 2006 (IL) .......................................... 176788

(51) Int. Cl.
*H04L 27/00* (2006.01)
(52) U.S. Cl. ....................................................... 375/316
(58) Field of Classification Search .................. 375/316, 375/343; 704/222, 226, 230; 708/517; 717/128, 717/131
See application file for complete search history.

(56) References Cited

U.S. PATENT DOCUMENTS

| 4,926,184 | A | 5/1990 | Galati et al. | |
| 5,341,139 | A | 8/1994 | Billaud et al. | |
| 7,890,323 | B2 * | 2/2011 | Akamatsu | 704/230 |
| 2004/0128654 | A1 * | 7/2004 | Dichter | 717/128 |
| 2006/0140314 | A1 * | 6/2006 | Kim et al. | 375/343 |

OTHER PUBLICATIONS

International Search Report and Written Opinion, mailed Jul. 23, 2008, from International Application No. PCT/IL/2007/000835, filed Jul. 4, 2007.

* cited by examiner

*Primary Examiner* — Sam K Ahn
(74) *Attorney, Agent, or Firm* — Houston Eliseeva, LLP

(57) ABSTRACT

A method and a calculating circuit for generating an output signal representing an actual amplitude of a received digitized signal having a magnitude of the actual amplitude equal or greater than a value of a saturation level of a dynamic range of a receiver. For the determination of the actual amplitude, firstly, a predetermined time interval is selected. Then, a total number of samples of the received digitized signal within the predetermined time interval is calculated. Further, a number of samples of the received digitized signal within the predetermined time interval with the amplitude equal to the saturation level is calculated. Thereafter, a ratio between the number of the samples with the amplitude value equal to the saturation level and the total number of the samples is calculated. For calculation of the magnitude of the actual amplitude a predetermined relationship between the magnitude of the amplitude and the ratio is applied and the output signal representing the actual amplitude is provided.

10 Claims, 6 Drawing Sheets

ELECTRONIC CIRCUITRY AND METHOD FOR DETERMINATION OF AMPLITUDES OF RECEIVED SIGNALS

RELATED APPLICATIONS

This application is a Continuation of PCT application serial number PCT/IL2007/000835, filed on Jul. 4, 2007, which claims priority to Israeli Patent Application No. IL 176788, filed on Jul. 11, 2006, both of which are incorporated herein by reference in their entirety.

FIELD OF THE INVENTION

This invention relates to DSP-based systems, and in particular, to a method and an electronic circuitry for determination of amplitudes of received signals.

BACKGROUND OF THE INVENTION

In Digital Signal Processing (DSP) based systems, a dynamic range of a system is defined as a ratio of the largest amplitude of processing signal to the smallest amplitude of processing signal, and can be estimated by utilizing the following equation Dynamic Range (dB)=20 $\log_{10}(2^N) \approx 6.02N$, where N represents the data word length of the analog-to-digital (AD) converter or the digital signal processor.

One of the problems associated with DSP-based systems is "overload," or saturation that can occur when amplitude of the processing signal exceeds a border of the dynamic range of the system. Such a border is usually referred to as a saturation level.

For example, monopulse antenna systems may employ various amplitude comparison methods for direction finding (see, for example, U.S. Pat. No. 4,926,184 to Galati, etc.). Such systems are adapted to simultaneously emit radar pulses toward a target object from two antennas of different directionality and to find the direction of the target object from comparison of radiation patterns obtained. When one or both antennas are close to the targets, the amplitudes of received signals can exceed the saturation level of the dynamic range of the receiver. As a result of the exceeding of the receiver's saturation level, any directional information can be lost.

SUMMARY OF THE INVENTION

There is a need in the art and, and it would be useful to have a method and an electronic circuitry for determination of an amplitude of a received signal having amplitude above the saturation level.

The present invention satisfies the aforementioned need by providing a method for generating an output signal representing an actual amplitude of a received digitized signal having a magnitude $A_s$ of the actual amplitude equal or greater than a value of a saturation level L of a dynamic range of a receiver. The method includes calculating a total number $N_{tot}$ of samples of the received digitized signal within a predetermined time interval, and calculating a number $N_s$ of samples of the received digitized signal with the amplitude equal to the saturation level within this predetermined time interval. The method further includes calculating a ratio $R_s$ between the number $N_s$ of the samples with the amplitude value equal to the saturation level and the total number $N_{tot}$ of the samples. Then, a predetermined relationship between the magnitude of the amplitude and the ratio $R_s$ can be used for determining the magnitude of the actual amplitude. Finally, the output signal representing said actual amplitude can be provided.

The present invention satisfies the aforementioned need by providing a calculating circuit configured for generating an output signal representing an actual amplitude of a received digitized signal having a magnitude $A_s$ of the actual amplitude equal or greater than a value of a saturation level L of a dynamic range of a receiver. The calculating circuit includes a sample calculator circuit configured for calculating a total number $N_{tot}$ of samples of the received digitized signal and a number $N_s$ of samples of the received digitized signal with the amplitude equal to the saturation level within a predetermined time interval.

The calculating circuit further includes a divider circuit configured for calculating a ratio $R_s$ between the number $N_s$ of the samples with the amplitude value equal to the saturation level and the total number $N_{tot}$ of the samples. Finally, the calculating circuit further includes an amplitude calculator circuit configured for applying a predetermined relationship between the magnitude of the amplitude and the ratio $R_s$, thereby determining the magnitude of the actual amplitude and providing the output signal representing the actual amplitude.

According to one embodiment of the invention, the predetermined relationship is represented by the following equation:

$$A_s = 20\log_{10}\left(\frac{10^{L/20}}{\sin(\frac{\pi}{2}(1-R_s))}\right)$$

where the magnitude of the actual amplitude is measured in decibels (dB).

According to another embodiment of the invention, the predetermined relationship is presented as a reference curve provided for a required saturation level L. Such a reference curve defines a dependence of the actual amplitude on the ratio $R_s$ for this saturation level L. It should be understood that the reference curve can be presented as a look-up table stored in a memory circuit and provided for a required number of saturation levels L.

The present invention further satisfies the aforementioned need by providing a program storage device readable by machine, tangibly embodying a program of instructions executable by the machine to perform method steps for generating an output signal representing an actual amplitude of a received digitized signal having a magnitude $A_s$ of the actual amplitude equal or greater than a value of a saturation level L of a dynamic range of a receiver, the method steps comprising:

selecting a predetermined time interval;
  calculating a total number $N_{tot}$ of samples of the received digitized signal within said predetermined time interval;
  calculating a number $N_s$ of samples of the received digitized signal within said predetermined time interval with the amplitude equal to the saturation level;
  calculating a ratio $R_s$ between the number $N_s$ of the samples with the amplitude value equal to the saturation level and the total number $N_{tot}$ of the samples; and
  applying a predetermined relationship between said magnitude of the amplitude and said ratio $R_s$ for determining said magnitude of the actual amplitude;
  providing said output signal representing said actual amplitude.

The present invention further satisfies the aforementioned need by providing a computer program product comprising a computer useable medium having computer readable program code embodied therein for generating an output signal representing an actual amplitude of a received digitized signal having a magnitude $A_s$ of the actual amplitude equal or greater than a value of a saturation level L of a dynamic range of a receiver, the computer program product comprising: computer readable program code for causing the computer to select a predetermined time interval; computer readable program code for causing the computer to calculate a total number $N_{tot}$ of samples of the received digitized signal within said predetermined time interval; computer readable program code for causing the computer to calculate a number $N_s$ of samples of the received digitized signal within said predetermined time interval with the amplitude equal to the saturation level; computer readable program code for causing the computer to calculate a ratio $R_s$ between the number $N_s$ of the samples with the amplitude value equal to the saturation level and the total number $N_{tot}$ of the samples; and computer readable program code for causing the computer to apply a predetermined relationship between said magnitude of the amplitude and said ratio $R_s$ for determining said magnitude of the actual amplitude; computer readable program code for causing the computer to provide said output signal representing said actual amplitude.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

The principles and operation of the calculating circuit according to the present invention may be better understood with reference to the drawings and the accompanying description, it being understood that these drawings and examples in the description are given for illustrative purposes only and are not meant to be limiting.

Figure 1A:
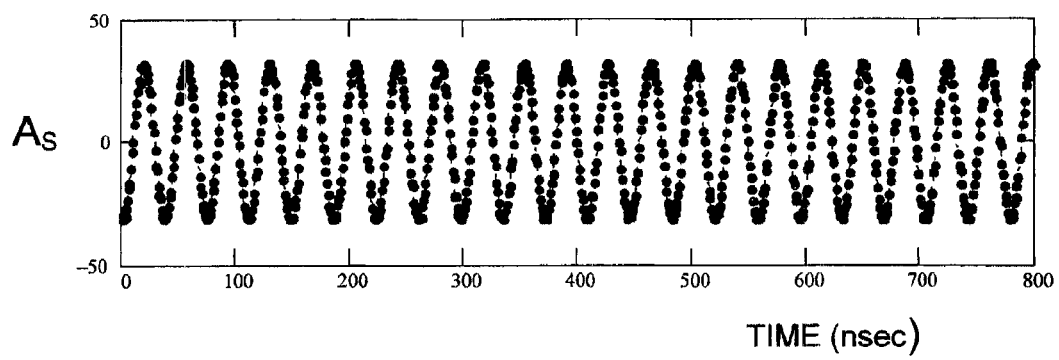
FIGS. 1a-1d show exemplary simulated data selected after AD conversion of time-varying signals all having one predetermined frequency and sampling rate, but different maximal amplitude values, respectively.
Figure 1B:
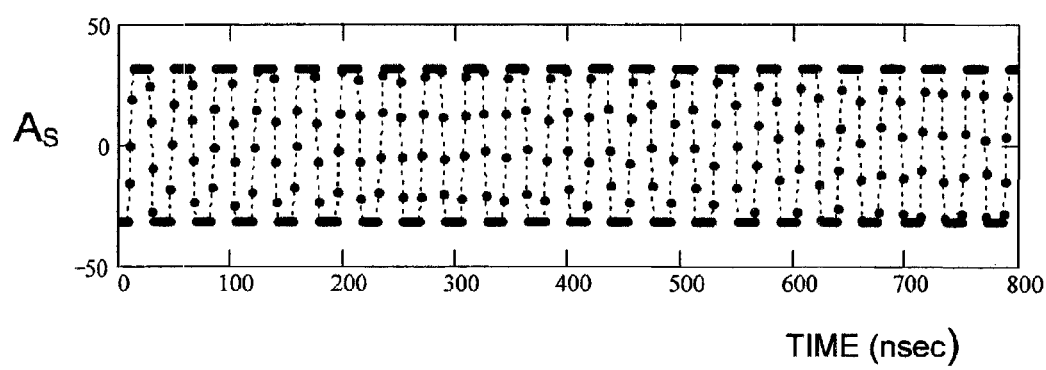
Figure 1C:
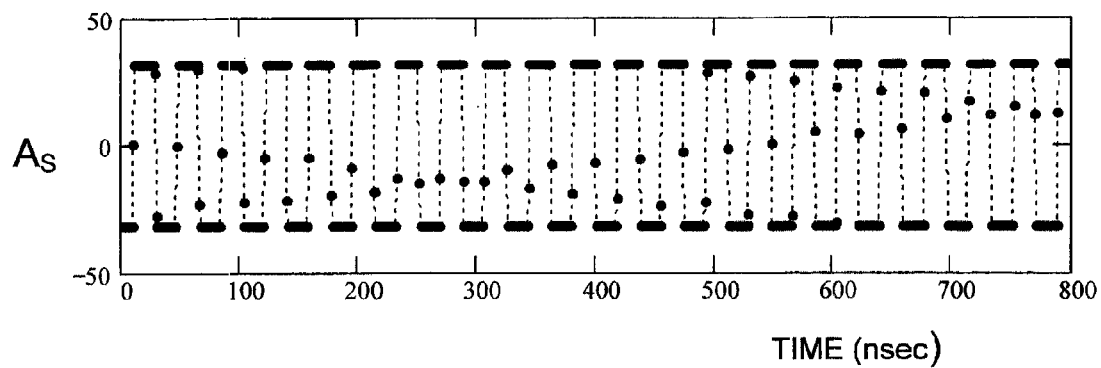
Figure 1D:
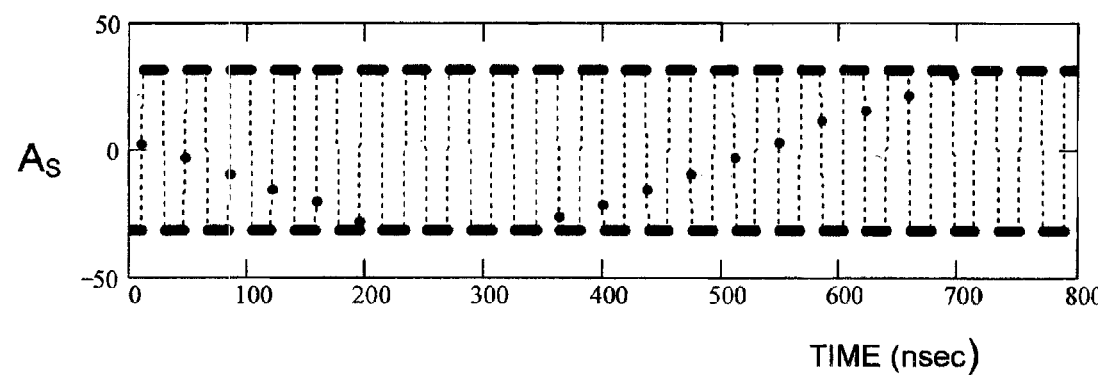

Some portions of the detailed descriptions, which follow hereinbelow, are presented in terms of algorithms and symbolic representations of operations on data represented as physical quantities within registers and memories of a computer system. An algorithm is here conceived to be a sequence of steps requiring physical manipulations of physical quantities and leading to a desired result. Usually, although not necessarily, these quantities take the form of electrical or magnetic signals capable of being stored, transferred, combined, compared, and otherwise manipulated. In the present description, these signals will be referred to as values, magnitudes, elements, symbols, numbers, or the like. Unless specifically stated otherwise, throughout the description, utilizing terms such as "processing" or "computing" or "calculating" or "determining" or "generating" or the like, refer to the action and processes of an electronic calculating circuit or a computer system or similar electronic computing device, that manipulates and transforms data. Referring to FIGS. 1a-1d, a digitized representation of exemplary time-varying signals generated by simulation is illustrated. The signals include a certain normal noise component and have frequency of 27 MHz and sampling rate of 1 GHz for 8-bit samples. The saturation level L of the dynamic range of a receiver is selected to be 31.6 dB. Specifically, FIG. 1a shows the signal when the maximal amplitude of the data words in the signal is equal to the saturation level of the dynamic range of the receiver. In turn, FIGS. 1b-1c illustrate a digitized representation of signals having the frequency similar to that of the signal shown in FIG. 1a (i.e. 27 MHz), but having actual amplitude of the data words greater than the saturation level of the dynamic range of the receiver by 10 dB, 20 dB and 30 db, respectively. The receiver is saturated during saturation time periods, i.e., when the actual amplitude of the signal is greater than the saturation level.

For a predetermined time interval T, a number $N_s$ of the data samples located within the saturation periods and having amplitudes equal to the saturation level L has a certain value. In particular, for the example shown in FIG. 1a, for the time interval T of 800 ns, the number $N_s$ of the data samples with the amplitude equal to the saturation level $L_s$ is equal to 57. Accordingly, a ratio $R_s$ between the number $N_s$ of the samples with the amplitude value equal to the saturation level and the total number $N_{tot}$ of the samples within the time interval T is equal to 0.071 (i.e., $R_s = N_s/N_{tot} = 57/800 \approx 0.071$).

In the cases shown in FIGS. 1b-1c, the samples with the amplitude greater than the magnitude of saturation level L will be located within the saturation level. Accordingly, for the same predetermined time interval T, the number $N_s$ of the samples located within to the saturation level will be greater than such a number in the case shown in FIG. 1a. In particular, for the example shown in FIG. 1b, this number $N_s$ is equal to 635. Accordingly, the ratio $R_s$ between the number $N_s$ of the samples with the amplitude value equal to the saturation level and the total number $N_s$ of the samples within the time interval T (i.e., $R_s = N_s/N_{tot}$) is equal to 0.794. Likewise, for the examples shown in FIG. 1c and FIG. 1d, the values of $R_s = N_s/N_{tot}$ are equal to 0.938 and 0.980, respectively.

Figure 2A:
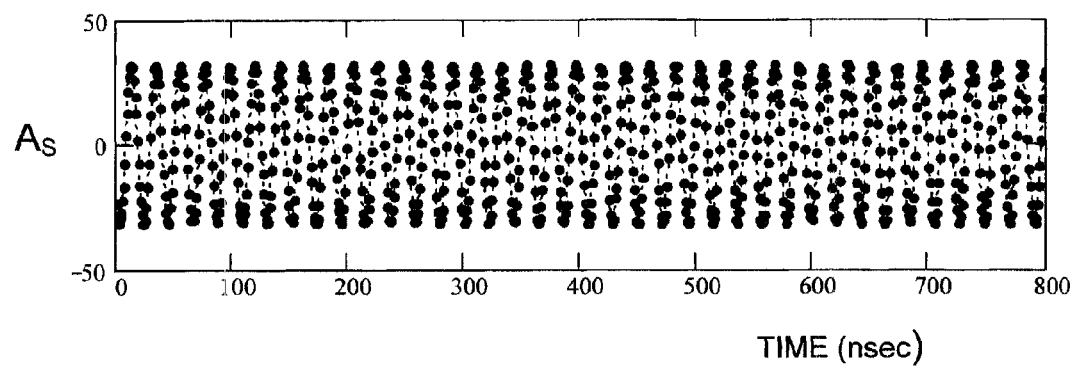
FIGS. 2a-2d show exemplary simulated data selected after AD conversion of time-varying signals different from signals shown in FIGS. 1a-1d in the fact that they having another predetermined frequency than the signals shown in FIGS. 1a-1d.
Figure 2B:
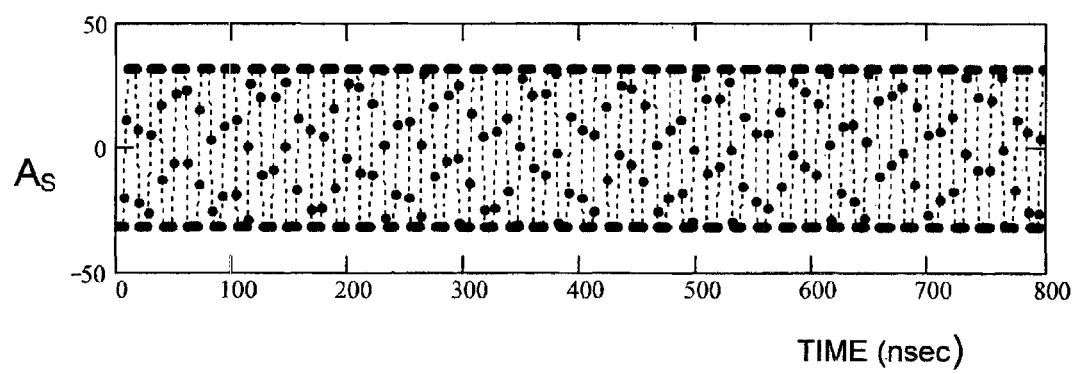
Figure 2C:
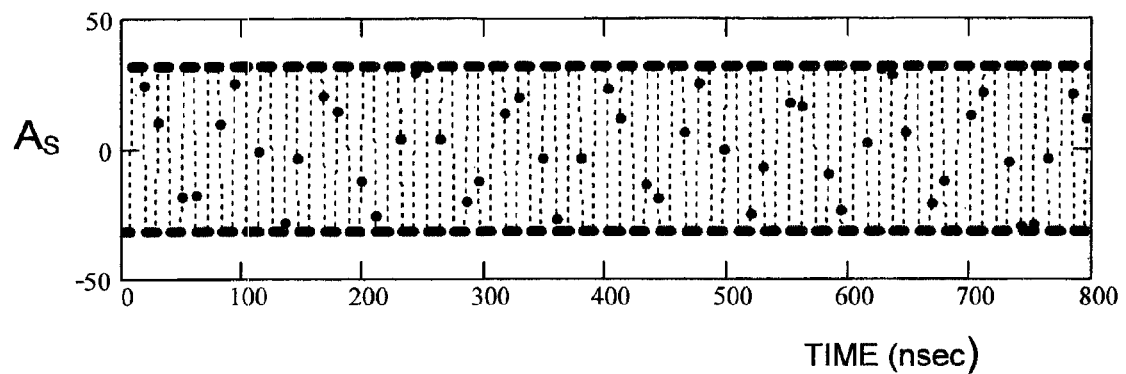
Figure 2D:
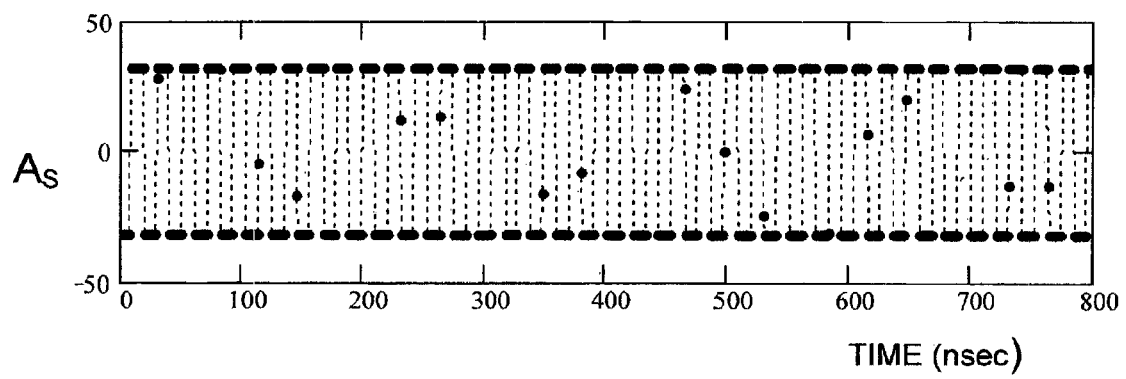

Referring to FIGS. 2a-2d, a digitized representation of signals which are different in frequency from the signals shown in FIGS. 1a-1d is illustrated. Specifically, the frequency of 47 MHz has been selected, whereas the same sampling rate of 1 GHz has been maintained for all these cases. FIG. 2a shows the signal when the actual amplitude of the data words in the signal is equal to the saturation level of the dynamic range of the receiver, whereas FIGS. 2b-2c illustrate a digitized representation of the signals having the actual amplitude of the signal greater than the saturation level of the dynamic range of the receiver by 10 dB, 20 dB and 30 db, respectively.

The number $N_s$ of the data samples with the amplitude value equal to the saturation level L for the cases corresponding to FIGS. 2a-2d is equal to 47, 638, 749 and 784, respectively. Accordingly, the ratio $R_s$ between the number $N_s$ of the samples with the amplitude value located within the saturation level and the total number $N_{tot}$ of the samples within the time interval T is equal to 0.059, 0.797, 0.936 and 0.98, respectively.

Figure 3:
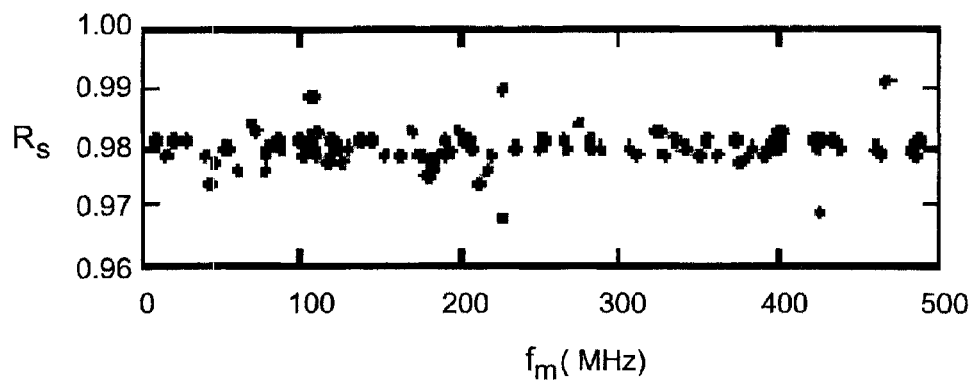
FIG. 3 shows an example of the dependence of the ratio between the number of the samples with the amplitude value equal to the saturation level and the total number of the samples on the frequency.

It was found that for the cases when the actual amplitudes of the samples are greater than the saturation level, the values of the ratio $R_s$ depend insignificantly on the frequency of the signal. For example, the dependence of the ratio $R_s$ on the frequency for the case when the actual amplitude of the data words exceeds the saturation level of the dynamic range of the receiver by 30 db is shown in FIG. 3. As can be seen, the value of the ratio $R_s$ is centered around the value of 0.98 for all the frequencies in a rather broad set of frequencies located in the region of 5 MHz to 495 MHz with the increment of 5 MHz. According to the present invention, the knowledge of the ratio $R_S$ provides a possibility to determine actual amplitude of the signal when the magnitude of this amplitude is greater than the saturation level.

Thus, the present invention provides a method for determination of an actual amplitude of a received digitized signal having a magnitude $A_s$ of the actual amplitude equal or greater than a value of a saturation level L of a dynamic range of a receiver. The method includes calculating a total number $N_{tot}$ of samples of the received digitized signal within a predetermined time interval. Likewise, the method includes calculating a number $N_s$ of samples of the received digitized signal with the amplitude equal to the saturation level within this predetermined time interval. In other words, the number $N_s$ is calculated during the saturation time periods when the actual amplitude of the signal is equal or greater than the saturation level L.

The method further includes calculating the ratio $R_s$ between the number $N_s$ of the samples with the amplitude equal to the saturation level and the total number $N_{tot}$ of the samples. Then, a predetermined relationship between the magnitude of the actual amplitude and the ratio $R_s$ can be used for determining the magnitude of the actual amplitude. Finally, the output signal representing the actual amplitude $A_s$ can be provided.

According to one embodiment of the invention, the predetermined relationship is represented by the following equation:

$$A_s = 20\log_{10}\left(\frac{10^{L/20}}{\sin(\frac{\pi}{2}(1-R_s))}\right) \quad (1)$$

where the magnitude of the actual amplitude is measured in decibels (dB). Thus, the actual amplitude $A_s$ can be obtained by substituting a required value for L and a calculated value for $R_s$ into Eq. (1).

Figure 4:
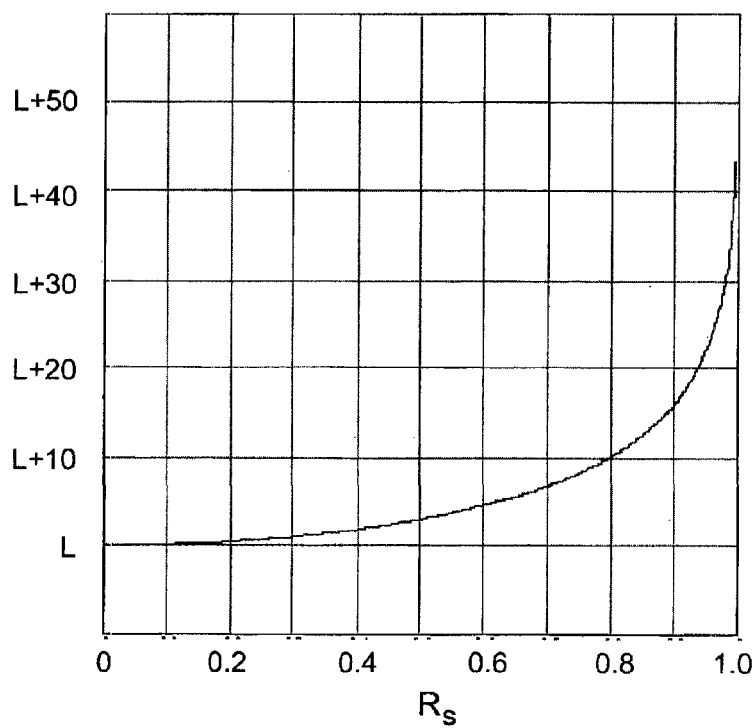
FIG. 4 shows an exemplary relationship between an actual amplitude $A_s$ of the received signal and the ratio between the number of the samples with the amplitude value equal to the saturation level and the total number of the samples represented as a reference curve.

According to another embodiment of the invention, the predetermined relationship can be presented as a reference curve provided for a required saturation level L. FIG. 4 shows such a relationship represented as a reference curve that defines a dependence of the actual amplitude $A_s$ on the ratio $R_s$. The actual amplitude $A_s$ is provided on the ordinate-axis as $A_s$=L+ΔA, where the increment ΔA equals 10 dB. As can be seen in FIG. 4, the method can be used for determination of actual amplitudes up to the magnitude of L+50 dB. When the "oversaturation" exceeds 50 dB, almost all the samples are located within the saturation time periods and the ratio $R_s \approx 1$.

After determination, the magnitude of the actual amplitude can be provided to the corresponding device for a required application. When desired, the calculated amplitude can be stored in a memory unit of the device for utilization in future applications. For example, the algorithm of the present invention for calculation of actual amplitudes can be used in various amplitude comparison methods for direction finding.

Figure 5:
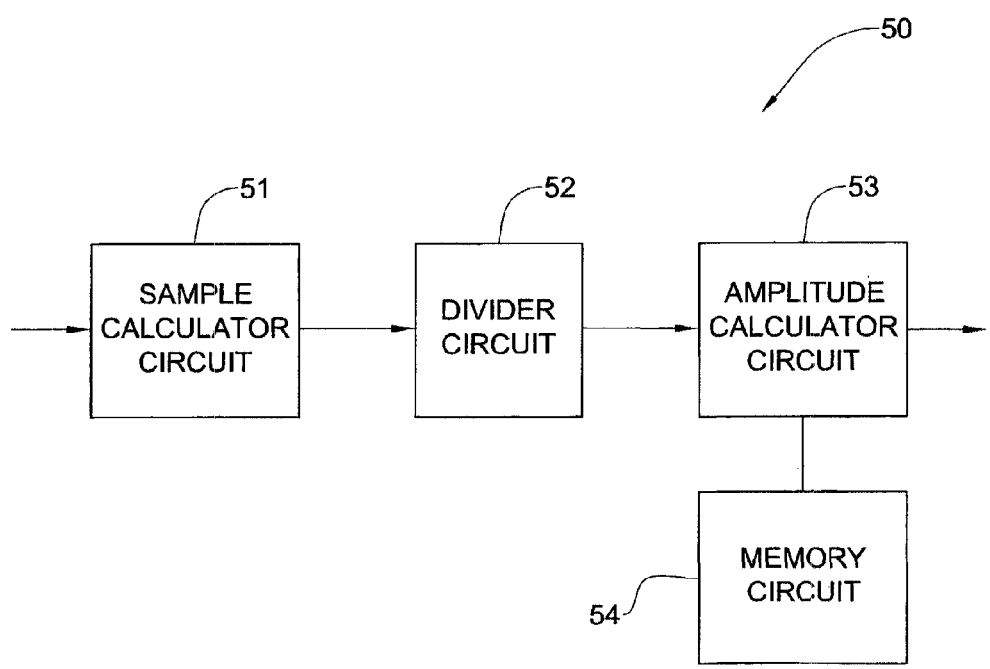
FIG. 5 shows an exemplary schematic block diagram of a calculating circuit configured for determining an actual amplitude of a received digitized signal having a magnitude equal or greater than a value of a saturation level of a dynamic range of a receiver.

Referring to FIG. 5, a non-limiting exemplary schematic block diagram of a calculating circuit 50 configured for generating an output signal representing an actual amplitude of a received digitized signal having a magnitude $A_s$ of the actual amplitude equal or greater than a value of a saturation level L of a dynamic range of a receiver (not shown) is illustrated. It should be noted that the blocks in FIG. 5 are intended as functional entities only, such that the functional relationships between the entities are shown, rather than any physical connections and/or physical relationships.

The calculating circuit 50 includes a sample calculator circuit 51 configured for receiving the digitized signal and calculating a total number $N_{tot}$ of samples of the received digitized signal within a predetermined time interval. The sample calculator circuit 51 can be also adapted for calculation of a number $N_s$ of samples of the received digitized signal located in the saturation intervals. Although these samples may have actual amplitudes greater than the saturation level within the predetermined time interval, the apparent value of these samples in the saturation time periods will be equal to the saturation level L, owing to the saturation.

The calculating circuit 50 further includes a divider circuit 52 configured for calculating a ratio $R_s$ between the number $N_s$ of the samples located with the saturation time periods and the total number $N_{tot}$ of the samples. Finally, the calculating circuit further includes an amplitude calculator circuit 53 configured for applying a predetermined relationship between the magnitude of the amplitude and the ratio $R_s$, thereby determining the magnitude of the actual amplitude and providing the output signal representing the actual amplitude.

According to one embodiment of the invention, the amplitude calculator circuit 53 can utilize a predetermined relationship in the form of Eq. (1).

According to another embodiment of the invention, the predetermined relationship is presented as a reference curve provided for a required saturation level L. Such a reference curve defines a dependence of the actual amplitude on the ratio $R_s$ for this saturation level L. For example, the reference curve can be represented as a look-up table stored in a memory circuit 54 of the calculating circuit 50 and provided for a required number of saturation levels L.

As such, those skilled in the art to which the present invention pertains, can appreciate that while the present invention has been described in terms of preferred embodiments, the concept upon which this disclosure is based may readily be utilized as a basis for the designing of other structures, systems and processes for carrying out the several purposes of the present invention.

It will also be understood that the system according to the invention may be a suitably programmed computer. Likewise, the invention contemplates a computer program being readable by a computer for executing the method of the invention.

The invention further contemplates a machine-readable memory tangibly embodying a program of instructions executable by the machine for executing the method of the invention, Also, it is to be understood that the phraseology and terminology employed herein are for the purpose of description and should not be regarded as limiting.

It should be noted that the word "comprising" as used throughout the appended claims is to be interpreted to mean "including but not limited to". It is important, therefore, that the scope of the invention is not construed as being limited by the illustrative embodiments set forth herein. Other variations are possible within the scope of the present invention as defined in the appended claims and their equivalents.

What is claimed is:

1. A method for use with a signal receiver having a dynamic range characterized by a certain saturation level and comprising a calculating circuit (50) that comprises a sample calculator circuit (51), a divider circuit (52) coupled to said sample calculator circuit (51), an amplitude calculator circuit (53) coupled to said divider circuit (52), and a memory unit (54) associated with said calculating circuit (50);

the method for operating said calculating circuit (50) to provide to said signal receiver an actual amplitude of a digitized signal received by said signal receiver, the signal having a magnitude A, of the actual amplitude equal to or greater than a value of the certain saturation level of the dynamic range of said signal receiver, the method comprising:

selecting a predetermined time interval;

by using said sample calculator circuit (51), calculating a total number $N_{tot}$ of samples of the received digitized signal within said predetermined time interval;

by using said sample calculator circuit (51) calculating a number $N_s$ of samples of the received digitized signal within said predetermined time interval with the amplitude equal to the saturation level;

by using said divider circuit (52), calculating a ratio $R_s$ between the number $N_s$ of the samples with the amplitude value equal to the saturation level and the total number $N_{tot}$ of the samples; and applying a predetermined relationship between said magnitude of the amplitude and said ratio $R_s$ for determining said magnitude of the actual amplitude;

providing said output signal representing said actual amplitude to said signal receiver.

2. The method of claim 1, wherein said predetermined relationship is the following equation:

$$A_s = 20\log_{10}\left(\frac{10^{L/20}}{\sin(\frac{\pi}{2}(1-R_s))}\right),$$

where L is a required saturation level, and said magnitude of the actual amplitude is measured in decibels (dB).

3. The method of claim 1, wherein said predetermined relationship is a reference curve provided for a required saturation level L, defining a dependence of the actual amplitude on the ratio $R_s$ for the required saturation level L.

4. The method of claim 3, wherein said reference curve is a look-up table stored in said memory unit (54) and provided for the required saturation level L, said look-up table defining a dependence of the actual amplitude on the ratio $R_s$ for the required saturation level L.

5. A calculating circuit for generating an output signal representing an actual amplitude of a received digitized signal having a magnitude $A_s$ of the actual amplitude equal to or greater than a value of a certain saturation level of a dynamic range of a signal receiver, comprising:

a sample calculator circuit configured for receiving the digitized signal, and calculating a total number $N_{tot}$ of samples of the received digitized signal and a number $N_s$ of samples of said received digitized signal with the amplitude equal to the certain saturation level within a predetermined time interval;

a divider circuit configured for calculating a ratio $R_s$ between the number $N_s$ of the samples with the amplitude value equal to the certain saturation level and the total number $N_{tot}$ of the samples;

an amplitude calculator circuit configured for applying a predetermined relationship between said magnitude of the amplitude and said ratio $R_s$ for determining said magnitude of the actual amplitude and providing said output signal representing said actual amplitude to the signal receiver.

6. The calculating circuit of claim 5, wherein said predetermined relationship is the following equation:

$$A_s = 20\log_{10}\left(\frac{10^{L/20}}{\sin(\frac{\pi}{2}(1-R_s))}\right),$$

where L is a required saturation level, and said magnitude of the actual amplitude is measured in decibels (dB).

7. The calculating circuit of claim 5, wherein said predetermined relationship is presented as a look-up table provided for a required saturation level L, said look-up table defining a dependence of the actual amplitude on the ratio $R_s$ for the required saturation level L.

8. The calculating circuit of claim 7, comprising a memory unit associated with said calculating circuit and configured for storing said look-up table.

9. A non-transitory program storage device readable by machine, tangibly embodying a program of instructions executable by the machine to perform method steps for generating an output signal representing an actual amplitude of a received digitized signal having a magnitude $A_s$ of the actual amplitude equal or greater than a value of a certain saturation level of a dynamic range of a signal receiver, the method steps comprising:

selecting a predetermined time interval;

calculating a total number $N_{tot}$ of samples of the received digitized signal within said predetermined time interval;

calculating a number $N_s$ of samples of the received digitized signal within said predetermined time interval with the amplitude equal to the saturation level;

calculating a ratio $R_s$ between the number $N_s$ of the samples with the amplitude value equal to the saturation level and the total number $N_{tot}$ of the samples; and applying a predetermined relationship between said magnitude of the amplitude and said ratio $R_s$ for determining said magnitude of the actual amplitude;

providing said output signal representing said actual amplitude to the signal receiver.

10. A computer program product comprising a non-transitory computer useable medium having computer readable program code embodied therein for generating an output signal representing an actual amplitude of a received digitized signal having a magnitude $A_s$ of the actual amplitude equal or greater than a value of a certain saturation level of a dynamic range of a signal receiver, the computer program product comprising:

computer readable program code for causing the computer to select a predetermined time interval;

computer readable program code for causing the computer to calculate a total number $N_{tot}$ of samples of the received digitized signal within said predetermined time interval;

computer readable program code for causing the computer to calculate a number $N_s$ of samples of the received digitized signal within said predetermined time interval with the amplitude equal to the saturation level;

computer readable program code for causing the computer to calculate a ratio $R_s$ between the number $N_s$ of the samples with the amplitude value equal to the saturation level and the total number $N_{tot}$ of the samples; and computer readable program code for causing the computer to apply a predetermined relationship between said magnitude of the amplitude and said ratio $R_s$ for determining said magnitude of the actual amplitude;

computer readable program code for causing the computer to provide said output signal representing said actual amplitude to said signal receiver.

* * * * *